United States Patent [19]

Ishihara et al.

[11] Patent Number: 4,689,093
[45] Date of Patent: Aug. 25, 1987

[54] PROCESS FOR THE PREPARATION OF PHOTOELECTROMOTIVE FORCE MEMBER

[75] Inventors: Shunichi Ishihara, Ebina; Keishi Saito, Nabari; Shunri Oda, Tokyo; Isamu Shimizu, Yokohama, all of Japan

[73] Assignee: Canon Kabushiki Kaisha, Tokyo, Japan

[21] Appl. No.: 843,304

[22] Filed: Mar. 24, 1986

[30] Foreign Application Priority Data

Mar. 28, 1985 [JP] Japan .................................. 60-064241

[51] Int. Cl.[4] ................... H01L 21/205; H01L 31/18
[52] U.S. Cl. ........................................ 437/5; 136/258;
427/39; 427/42; 427/45.1; 427/74; 427/255.1;
427/255.2; 148/DIG. 1; 148/DIG. 169;
118/723; 437/173
[58] Field of Search ................... 148/1.5, 174, DIG. 1,
148/DIG. 169; 427/39, 42, 45.1, 46, 51, 54.1,
55, 74, 86, 255.1, 255.2; 29/572; 136/258 AM

[56] References Cited

U.S. PATENT DOCUMENTS 4,439,463 3/1984 Miller .................................... 427/39

FOREIGN PATENT DOCUMENTS 57-66625 4/1982 Japan ........................... 136/258 AM

OTHER PUBLICATIONS

M. H. Brodsky et al, *IBM Tech. Disc. Bull.*, vol. 22, No. 8A, Jan. 1980, pp. 3391–3392.

*Primary Examiner*—Aaron Weisstuch
*Attorney, Agent, or Firm*—Fitzpatrick, Cella, Harper & Scinto

[57] ABSTRACT

Process for preparing a photoelectromotive force member by forming a photoelectric conversion layer on a substrate by: (a) generating an active species by the action of microwave energy on a substance in a space leading to a film forming space containing a substrate; (b) generating a precursor by the action of microwave energy on a substance in a space situated within the space for generating the active species; and (c) introducing the resulting active species and precursor into the film forming space to chemically react them and to form the photoelectric conversion layer.

3 Claims, 7 Drawing Figures

PROCESS FOR THE PREPARATION OF PHOTOELECTROMOTIVE FORCE MEMBER

FIELD OF THE INVENTION

This invention relates to a photoelectromotive force member such as photovoltaic members and the like and to a process and an apparatus for preparing the same.

BACKGROUND OF THE INVENTION

There have been proposed a number of photoelectromotive force members having a photoelectric conversion layer composed of amorphous silicon for use in photovoltaic devices and the like.

Various methods for preparing photoelectric conversion layers by means of vacuum evaporation, thermal induced chemical vapor deposition, plasma chemical vapor deposition, reactive sputtering, ion plating and light induced chemical vapor deposition have also been proposed.

Among those methods, the method of thermal induced chemical vapor deposition (hereinafter referred to as "CVD method") had once been frequently used in various applications. However, such methods are not usually employed for the reason that, besides requiring an elevated temperature, a practically usable photoelectric conversion layer cannot be obtained as expected.

On the other hand, the plasma chemical vapor deposition method (hereinafter referred to as "plasma CVD method") has been generally evaluated as being the most preferred and is currently used to prepare the photoelectric conversion layer of photoelectromotive force members on a commercial basis.

However, for any of the known photoelectromotive force members which have a photoelectric conversion layer composed of amorphous silicon, even if it is obtained by the plasma CVD method, there are still unsolved problems regarding performance characteristics, particularly its electric and optical characteristics, deterioration resistance, and use-environment characteristics upon repeated use, and also homogeneity, reproducibility, and mass-productivity.

Now, although the plasma CVD method is widely used nowadays as above mentioned, that method is problematical due to the fact that it is practiced under elevated temperature conditions and other problems are associated with the apparatus to be used.

Regarding the former problems, because the plasma CVD method is practiced while maintaining a substrate at an elevated temperature, firstly the kind of a substrate to be used is limited to one that does not contain a material such as a heavy metal which can migrate and cause changes in the characteristics of a deposited layer to be formed and secondly, its thickness is likely to be varied, whereby the resulting layer lacks uniformity of thickness and homogeneity of the composition, which may itself also cause changes in the characteristics of the layer to be formed.

Regarding the latter problems, the operating conditions employed with the plasma CVD method are much more complicated than the known CVD method, and are extremely difficult to be generalized.

That is, there already exist a number of variations even in the corelated parameters of substrate temperature, the amount and the flow rate of gases to be introduced, the pressure, the high frequency power for forming a layer, the structure of the electrodes, the structure of the reaction chamber, the exhaust rate, the plasma generation system, etc. Under these circumstances, in order to prepare a desirable photoelectric conversion layer for a photoelectromotive force member, it is required to choose precise parameters from a great number of varied parameters. And there sometimes occurs a serious problem that because of the precisely chosen parameters, the plasma may attain an unstable state which often imparts unexpected troublesome effects to a photoelectric conversion layer to be formed.

As for the plasma CVD apparatus, its structure becomes complicated because the parameters to be employed are precisely chosen as above stated, and whenever the scale or the kind of the apparatus to be used is modified or changed, the apparatus must be so structured as to still provide said precisely chosen parameters.

In this regard, even if a desirable photoelectric conversion layer should be fortunately produced, the photoelectromotive force member product will become costly for the reasons that a heavy investment is necessitated to set up a particularly appropriate apparatus therefor. Then, as there still exist a number of process operation parameters even for such an apparatus, the relevant parameters must be precisely chosen from the existing various parameters for the preparation of such a desirable photoelectric conversion layer, and thus the process must be carefully practiced.

Against this background, there is now an increased demand for providing a method that makes it possible to practice the process at lower temperature and at a high film forming rate in a simple apparatus to mass-produce a desirable photoelectric conversion layer for a photoelectromotive force member which has good uniformity and has practically applicable characteristics.

Besides silicon, there is a similar situation with respect to other kinds of photoelectric conversion layers for photoelectromotive force members such as silicon nitride, silicon carbide, and silicon oxide layers.

SUMMARY OF THE INVENTION

The present inventors have conducted extensive studies in order to solve the problems in the aforementioned known methods and in order to develop a new process for effectively and simply preparing a photoelectromotive force member having a desirable photoelectric conversion layer, for instance, an amorphous silicon layer having practically applicable characteristics.

As a result, the present inventors have finally found a method that enables efficient and stable preparation of a desirable photoelectric conversion layer for photoelectromotive force member according to the simplified procedures detailed below.

It is therefore an object of this invention to provide an improved photoelectromotive force member having a desirable photoelectric conversion layer having practically applicable characteristics, which is prepared by chemically reacting a precursor contributing to form said photoelectric conversion layer and an active species without the use of plasma discharge.

Another object of this invention is to provide a new process for preparing the above photoelectric conversion layer using a precursor contributing to form the layer and an active species which can be chemically reacted at lower temperature and without the presence of a plasma to form the layer on a substrate for a photoelectromotive force member located in a reaction space of a closed system at a high deposition rate.

A further object of this invention is to provide an apparatus suitable for practicing said new process.

According to one aspect of this invention, the new process aims at accomplishing simplification of the layer forming conditions for the preparation of a photoelectric conversion layer so as to enable its mass-production while maintaining the characteristics of the layer to be formed and promoting the deposition rate at lower temperature in a deposition space without using a plasma reaction.

According to a further aspect of this invention, there is provided an improved photoelectromotive force member having a desirable photoelectric conversion layer which is prepared by introducing a precursor contributing to form the above layer and an active species which is chemically reactive with the precursor into a deposition space, the active species being passed through a transportation space leading to the deposition space and the precursor being passed through an other transportation space leading to the deposition space which is provided within the foregoing transportation space, and chemically reacting the two substances at lower temperature in the deposition space.

According to a further object of this invention, there is provided a process for preparing a desirable photoelectric conversion layer for a photoelectromotive force member, characterized in that a precursor contributing to form the layer and an active species chemically reactive with the precursor are used together, wherein the active species is passed through a transportation space of which the downstream side leads to a deposition space, the precursor is passed through another transportation space leading to the deposition which is provided within the foregoing transportation space, and the two substances thus introduced are chemically reacted to form the layer on a substrate for the photoelectromotive force member placed in the deposition space, in the absence of a plasma and without elevating the substrate temperature.

In accordance with an additional embodiment, a process is provided for preparing a photoelectromotive force member comprising: a photoelectric conversion layer on a substrate employing (i) a precursor as a constituent for the photoelectric conversion layer, which precursor is substantially nonreactive as long as it remains in its original energy state and (ii) an active species which can react with and impart energy to the precursor to activate the precursor to a state capable of contributing to formation of said layer which comprises:

(a) generating said active species by subjecting a substance capable of being activated to generate said active species to the action of microwave energy in an active species generating and transporting space leading to a film forming space containing the substrate;

(b) simultaneously generating said precursor by subjecting a substance capable of generating precursor to the action of microwave energy in a precursor generating and transporting space located separately from and within the active species generating and transporting space and open in a downstream region of that space; and (c) introducing the resulting active species and precursor into the film forming space to chemically react them to form the photoelectric conversion layer on the substrate in the absence of a plasma.

According to a further aspect of this invention, an apparatus is provided which is suitable for practicing the above process, characterized in that an active species generation space, an active species transportation passage being situated at the downstream side of the active species generation space, a precursor generation space, a precursor transportation passage being situated separately from and within the active species transportation passage and a deposition chamber having a substrate supporting means therein, are provided.

According to this invention, since a precursor contributing to form a deposited film and an active species chemically reactive with the precursor even at lower temperatures are used, there is no particular limitation on the kind of substrate to be used as in the known plasma CVD method, and the formation of a desirable photoelectric conversion layer on a substrate for a photoelectromotive force member may be effectively carried out at a high deposition rate without elevating the temperature of the substrate, namely from 80° to 120° C. lower than in the known plasm CVD method, and moreover, in the absence of a plasma.

In addition, according to this invention, the control of the layer forming conditions is relaxed and quality control of a layer to be formed can be easily implemented because the deposition space is situated separately from the space for generating the precursor and from the space for generating the active species, the former space and the latter spaces being separate from one another, and a plasma discharge is not utilized.

In this invention, an active species and a precursor are respectively introduced into a film forming space through an active species transportation space and a precursor transportation space. It is possible to optionally determine the residence time for the precursor within the precursor transportation space by appropriately changing the location of its open portion within the active species transportation space, wherein the transportation rate of the precursor in the precursor transportation space may be chosen as one of the variable parameters to control the residence time.

The position where the precursor transportation space and the active species transportation space opens to the deposition space may be determined with due regard to the life span of the active species and to the life span of the precursor.

As for the position of the active species transportation space which opens to the deposition space, it is preferred to be as close as possible to the layer forming region in the deposition space since there are generally used a precursor of a relatively long life span and an active species of a rather shorter life span.

The portions of the active species transportation space and the precursor transportation space which open to the deposition space are preferably in the form of a nozzle or an orifice.

And, particularly when both the open portions are in the form of a nozzle, the layer forming and feed consumptive efficiencies may be remarkably improved by situating the nozzle openings at a closer position to the layer forming surface of the substrate in the deposition space.

In general, the active species is generated in a species activation space connected to the active species transportation space at its upstream portion, and the precursor is genersted in a precursor generation space connected to the precursor transportation space at its upstream portion.

However, as an alternative, both the active species transportation space and the precursor transportation space may be so structured as to double respectively as the active species generation space and the precursor generation space.

In that case, the active species generation means and the precursor generation means need not always be separately provided. The related system may be so structured that a sole means serves both as the active species generation means and the precursor generation means. As an example in this respect, there can be illustrated a double conduit such as a double glass pipe which is structured to have an inner passage as the active species transportation space and an outer passage as the precursor transportation space. In this case, there is placed a microwave power source around the circumference of the double conduit so as to generate at the same time an active species and a precursor flow in the direction of the gas current. The open portion of each of the active species transportation space and the precursor transportation space is preferred to be situated within the deposition space.

The number of double space structural conduits having the precursor transportation space horizontally situated within the active species transportation space, which is connected to the deposition space, is not limited to be one but may be pluralized.

In the latter case, a photoelectric conversion layer constituted by a plurality of active layers, each having a different characteristic, may be formed on a substrate for a photoelectromotive force member placed within the deposition space, by changing the kind of active species and/or the kind of precursor introduced through each of the double space structural conduits.

In that case, it is possible to simultaneously start forming each of the active layers on a respective position of the substrate. It is also possible to form such a multilayered film as having various active layers, for example, (A) to (N) layers by firstly forming the (A) layer, then the (B) layer, . . . and finally the (N) layer.

As a more detailed example, when a photoelectric conversion layer of a photoelectromotive force member having an n-type semiconductive layer, an i-type semiconductive layer, and a p-type semiconductive layer in this order from the side of the substrate is desired, it may be prepared by using three said double space structural conduits in the following way. That is, the n-type semiconductive layer is firstly formed on the substrate by using the first conduit, the i-type semiconductive layer is then formed on the n-type semiconductive layer already formed on the substrate by using the second conduit, and the remaining p-type semiconductive layer is finally formed on the n-type semiconductive layer by using the third conduit.

In this case, the formation of each of the three layers on the substrate may be carried out in the same deposition space by starting the formation of a successive layer after the formation of the former layer has been completed. And in another alternative of this case, the formation of each of the three layers may be carried out in concurrent progression of time simply by letting the starting time for the formation of each layer be delayed a predetermined time period, although there is somwhat of a local delay in the formation of each layers.

In this invention, it is a matter of course that the formation of each layer in the above case may be carried out in a different deposition space.

However, in the above case the most characteristic point of this invention is that multiple layers, each of which has a different characteristic, is formed in concurrent progression on a substrate for a photoelectromotive force member in the same deposition space.

Further, according to this invention, there are the advantages accruing from the formation of a photoelectric conversion layer of a photoelectromotive force member without elevating the temperature of the substrate and in the absence of plasma, this being distinguished from the case of the known plasma CVD method. For example, a desirable photoelectric conversion layer having a uniform thickness and a desirable homogeneity may be effectively formed at an improved deposition rate without the formed layer peeling off from the substrate, which often found in the known plasma CVD method when it is practiced with the substrate being maintained at lower temperature, and the layer which is formed on the substrate is not affected either by any of the undesirable materials removed from the inner surface of the surrounding wall of the deposition space or by the residual gases remaining in the deposition space, because the deposition space, the active species generation space, and the precursor generation space are individually situated.

The term "precursor" in this invention means a substance which can be a constituent of a photoelectric conversion layer of a photoelectromotive force member but cannot contribute to layer formation as long as it is in its usual or "ground level" energy state.

On the other hand, the term "active species" in this invention means a substance which causes a chemical reaction with the precursor to impart energy to the precursor thereby to cause the precursor to be in an activated energy state capable of contributing to formation of said layer.

Therefore, as for the active species to be used, it may be either a substance which contains one or more elements which are constituents of the desired photoelectric conversion layer of the photoelectromotive force member to be formed or a substance which does not contain such elements.

The precursor which is introduced into the deposition space through the precursor transportation space will become a principal constituent of the photoelectric conversion layer to be formed on the substrate for photoelectromotive force member in the deposition space. The longer the average life span of the precursor the better. A substance whose average life span is preferably greater than 0.01 second, more preferably greater than 0.1 second, and most preferably greater than 1.0 second is used.

The active species to be introduced into the deposition space through the active species transportation space should be a substance whose average life span is preferably less than 10 seconds, more preferably less than 8.0 seconds, and most preferably less than 5.0 seconds.

At the time when a photoelectric conversion layer is formed on a substrate for the photoelectromotive force member in the deposition space, the active species chemically reacts with the precursor containing one or more elements to be principal constituent(s) of the layer to be formed. The precursor is introduced into the deposition space at the same time when the active species is introduced thereinto through the active species transportation space, whereby the desired film is easily and effectively formed on the substrate.

According to this invention, because the photoelectric conversion layer may be formed without any generation of a plasma in the deposition space, there is no occasion for the layer to be subjected to the influence of an etching action or other actions due to unexpectedly occurring abnormal discharge and the like during its formation, as found in the known plasma CVD method.

The process for forming the photoelectric conversion layer of a photoelectromotive force member according to this invention is a modification of the known CVD method, and in order to be distinguished from the known CVD method, it will be appropriate to be categorized as the "New CVD method."

One remarkable point among others by which the New CVD method of this invention is clearly distinguished from the known CVD method is that there is used an active species which is generated in a space separately situated from the deposition space.

Because of this, this invention brings about various significant advantages such that in comparison with the known plasma CVD method, the deposition rate is greatly improved and at the same time, a photoelectric conversion layer superior in quality and having very stable characteristics may be obtained. In addition, the temperature of a substrate for the photoelectromotive force member is much lower than in the case of the known plasma CVD method when a photoelectric conversion layer is formed thereon, and a photoelectric conversion layer possessing excellent characteristics may be mass-produced on an industrial scale thereby enabling low cost production.

The active species to be used in this invention is generated in the active species generation space by activating a selected raw material to generate the active species, for example, by subjecting it to the action of an excitation energy source such as electric discharge, light, heat, or by reacting or contacting it with a catalyst or by adding the catalyst thereto.

Usable as the raw material are, for example, $H_2$, $SiH_4$, $SiH_3F$, $SiH_3Cl$, $SiH_3Br$, $SiH_3I$, etc., and other than these, rare gases such as He, Ne, Ar, etc. are also usable.

A suitable compound is used for the generation of the precursor to be used in this invention.

As such a compound, there is usually used a silicon containing compound in which an electron highly absorptive atom or atomic group or a polar radical is bonded to the silicon atom.

Said silicon containing compound is subjected to the action of an excitation energy source such as electric discharge, light, or heat to generate the precursor in the precursor generation space.

Usable as the silicon containing compound are, for example, $Si_nX_{2n+2}$ (n=1,2,3 - - -, X=F, Cl, Br, I), $(SiX_2)_n$ (n≧3, X=F, Cl, Br, I), $Si_nHX_{2n+1}$ (N=1,2,3 - - -, X=F, Cl, Br, I), $Si_nH_2X_{2n}$ (N=1,2,3 - - -, X=F, Cl, Br, I), etc.

Specific examples are $SiF_4$, $(SiF_2)_5$, $(SiF_2)_6$, $(SiF_2)_4$, $Si_2F_6$, $SiHF_3$, $SiH_2F_2$, $SiCl_4$, $(SiCl_2)_5$, $SiBr_4$, $(SiBr_2)_5$, etc. which are in the gaseous state or can be easily made to be in the gaseous state.

Other than these compounds, $SiH_2(C_6H_5)_2$, $SiH_2(CN)_2$, etc. may be also used in accordance with the intended use of the photoelectric conversion layer to be formed.

In a preferred embodiment of this invention, the precursor and the active species are well mixed in advance before being introduced into the deposition space. Soon after the mixture is introduced into the deposition space, if necessary, it is possible to apply light or heat energy to the inner atmosphere of the deposition space where the layer forming process is to be conducted or to the substrate placed in the deposition space and on which a photoelectric conversion layer is to be formed, thereby to further promote the deposition rate and to efficiently accomplish the layer formation.

The volume ratio of the precursor to the active species may be determined with due regard to the layer forming conditions, the kind of precursor to be used and the kind of active species to be used etc., but it is preferably 100:1 to 1:100 and more preferably 10:1 to 1:10 on the basis of a flow amount ratio.

The position of the precursor transportation space opening in the active species transportation space is situated preferably 0.1 mm to 200 mm, more preferably 1.0 mm to 100 mm distant from the position of the active species transportation space opening to the deposition space.

DESCRIPTION OF THE PREFERRED EMBODIMENT

Figure 1A:
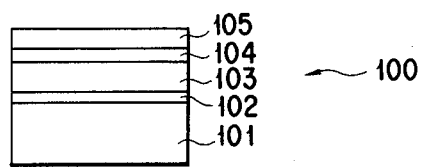
FIG. 1(A) is a cross-sectional view of a first representative embodiment of the photoelectromotive force member for a photovoltaic device provided according to this invention.

Referring to FIG. 1, photoelectromotive force member 100 is usable as a photovoltaic device, and has a structure composed of p-type (or n-type) semiconductive layer 102, i-type semiconductive layer 103, n-type (or p-type) semiconductive layer 104, and electroconductive layer 105 on substrate 101.

Substrate 101 may be electroconductive or electrically insulating.

Usable as an electroconductive substrate are, for example, metals such as Al, Cr, Mo, Au, Ir, Nb, Ta, V, Ti, Pt, Pd and the like, or alloys such as NiCr, stainless steel, or alloys of said metals.

Usable as an electrically insulating substrate are, for example, films or sheets of synthetic resin such as polyester, polyethylene, polycarbonate, cellulose acetate, polypropylene, polyvinyl chloride, polyvinylidene chloride, polystyrene, polyamide and the like, and other than these, glass or ceramics. For the electrically insulating substrate, it is desirable that at least one surface thereof be made conductive and the relevant layers are formed on the conductive surface of the substrate.

For example, in the case of glass, its surface may be made conductive by depositing a thin layer of metal such as NiCr, Al, Cr, Mo, Au, Ir, Nb, Ta, V, Ti, Pt, Pd, or a metal oxide such as $In_2O_3$, $SnO_2$, ITO ($In_2O_3 + SnO_2$), etc. In the case of synthetic resin film such as polyester film, etc., its surface may be made conductive with a metal such as NiCr, Al, Ag, Pd, An, Ni, Au, Cr, Mo, Ir, Nb, Ta, V, Ti, Pt, etc. by means of vacuum vapor deposition, electron beam vapor deposition, or sputtering. Its surface may also be made conductive by laminating it with one of said metals.

The shape of the substrate may be optionally determined. Examples are drum, belt, plate and suitable like shapes.

The thickness of the substrate is optional, but it is usually not less than 10 microns from the view points of its manufacturing and handling conveniences and its strength.

Figure 1B:
FIG. 1(B) is a cross-sectional view of a second representative embodiment of the photoelectromotive force member for a photovoltaic device provided according to this invention.
Figure 1B:
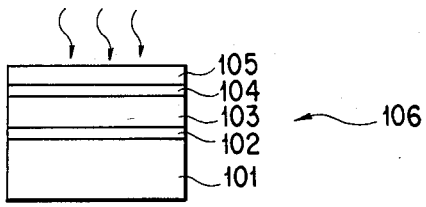

Substrate 101 may be either transparent or opaque. In the case when substrate 101 is transparent, electroconductive layer 105 may be opaque and the radiation of light is conducted from the side of substrate 101 as shown in FIG. 1(A). In the case when substrate 101 is opaque, electroconductive layer 105 should be of an optically transparent material and the radiation of light is conducted from the side of electroconductive layer 105 as shown in FIG. 1(B).

The p-type semiconductive layer 102 is composed of an amorphous material such as an a-Si (H, X) containing silicon and at least one of hydrogen (H) and halogen atoms (X), and which has been doped with a p-type impurity to be of p-type.

It is desirable of the p-type semiconductive layer 102 to be band-gap widened so as to exhibit a so-called window-effect by adding a band gap increasing element such as carbon, oxygen, nitrogen, or the like.

As the p-type impurity, there may be used an element of Group III A of the Periodic Table such as B, Al, Ga, In, Tl or the like. Of these p-type impurities, B and Ga are the most appropriate.

The amount of the p-type impurity to be contained in the p-type semiconductive layer 102 may be optionally determined in accordance with its end use, but it may be less than $3 \times 10^{-2}$ atomic %.

The process of doping the p-type semiconductive layer 102 with these impurities may be practiced by introducing a dopant imparting substance in the gaseous state into either the active species generation space or the precursor generation space possibly together with a gaseous substance to generate a precursor or a gaseous stock so as to generate an active species when the layer is being formed.

As a dopant imparting substance capable of incorporating the impurities into the layer, a substance which is in a gaseous state at room temperature or another substance which can be easily made to be in a gaseous state, at least under the layer forming conditions, may be employed.

Usuable as such substance are, for example, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc.

The formation of the p-type semiconductive layer 102 may be independently carried out; however, it is possible to continuously form the i-type semiconductive layer 103 and the n-type semiconductive layer 105 following the formation of the p-type semiconductive layer 102.

In the formation of p-type semiconductive layer 102, a gas for forming the p-type semiconductive layer may be mixed with a rare gas such as He and Ar in a predetermined volumetric mixing ratio when necessary.

In this invention, the formation of the p-type semiconductive layer 102 may be carried out, for example, in the following way.

First an active species raw material gas is introduced into the activation space, to which a relevant activation energy is applied thereby to form an atmosphere containing active species generated therein, which is then passed through the active species transportation space.

In parallel with this, a precursor raw material gas is introduced into the precursor generation space to which a relevant activation energy is applied thereby to generate a precursor, which is then passed through the precursor transportation space situated within the active species transportation space.

The gas containing active species and the gas containing precursors are mixed in a mixing space situated in the active species transportation space wherein the two substances will start chemically reacting, and the resulting gas mixture is then introduced into the film forming space, where the substrate 101 is placed, whereby the P-type semiconductive layer 102 is formed on the substrate 101. In this case, if necessary, energy may be applied to the inner atmosphere and/or the substrate 101 in order to further promote the deposition rate.

Usable as the above active species raw material for the formation of the P-type semiconductive layer are, for example, silane compounds abundant in hydrogen atoms, which are in the gaseous state or can be easily be made to be the gaseous state, such as $SiH_4$, $SiH_3Cl$, $SiH_3F$, $SiH_3Br$ and the like, nitrogen ($N_2$) or nitrogen compounds composed of nitrogen (N) and hydrogen atoms (H), which are in the gaseous state or can be easily made to be in the gaseous state, such as nitrides and azides such as $NH_3$, $H_2NNH_2$, $HN_3$, $NH_4N_3$ and the like, others than these, saturated hydrocarbons having 1 to 5 carbon atoms, ethylenic hydrocarbons having 2 to 5 carbon atoms, and acetylenic hydrocarbons having 2 to 4 carbon atoms.

As the saturated hydrocarbons, there may be illustrated $CH_4$, $C_2H_6$, $C_3H_8$, n—$C_4H_{10}$, and $C_5H_{12}$. As the ethylenic hydrocarbons, there may be illustrated $C_2H_2$, $C_3H_4$, and $C_4H_6$. And as the acetylenic hydrocarbons, there may be illustrated $C_2H_2$, $C_3H_4$, and $C_4H_6$.

In addition to these, the following are also usable as the active species raw material: $O_2$, $O_3$, CO, $CO_2$, NO, $NO_2$, $N_2O$ and the like.

The active species raw material to be used for the formation of the p-type semiconductive layer 102 is appropriately selected from those above illustrated and used so that a predetermined atom contained in the selected raw material may be sufficiently incorporated into the p-type semiconductive layer 102 to be formed.

As the precursor raw material used to generate a precursor in the precursor generation space, silane compounds such as $SiF_4$, $SiH_2F_2$ and the like may be illustrated, and these substances may easily generate precursors of a long average life span with the action of appropriate activation energy.

The thickness of the p-type semiconductive layer 102 is preferably 30 to 50,000 Å, more preferably 50 to 5000 Å, and furthermore preferably 50 to 1000 Å.

The i-type semiconductive layer 103 is to be structured so as to have photoconductive characteristics sufficient to function as the i-type semiconductive layer of the photoelectromotive force member. In consequence, the i-type semiconductive layer 103 is preferably composed of an amorphous silicon a-SiX (H) containing silicon as a main component, halogen (X), and if necessary hydrogen (H).

The formation of the i-type semiconductive layer 103 may be conducted in the same way as the formation of the p-type semiconductive layer 102. That is, an active species raw material such as $SiH_4$, $SiH_3F$ or the like is introduced into the activation space to which a appropriate activation energy is applied thereby to generate an active species, which is then passed through the active species transportation space. In parallel with this, a precursor raw material such as $SiF_4$, $SiF_2H_2$ or the lake is introduced into the precursor generation space to which an appropriate activation energy is applied thereby to generate a precursor, which is then passed through the precursor transportation space situated within the active species transportation space.

The gas containing active species and the gas containing precursors are mixed in a mixing space situated in the active species transportation space wherein the two substances start chemically reacting, and the resulting gas mixture is introduced into the film forming space, where the substrate 101 is placed, whereby the i-type semiconductive layer 103 is formed on the substrate 101.

Also in this case, if necessary, energy may be applied in order to further promote the deposition rate. As a result, a suitable i-type semiconductive layer 103 is formed.

The thickness of the i-type semiconductive layer 103 may be determined in accordance with its end use purpose.

As for the i-type semiconductive layer 103 of the photoelectromotive force member 100 or 106 as shown in FIG. 1(A) or FIG. 1(B), respectively, its thickness may be determined in reationship to the thickness of the p-type semiconductive layer 102 and the thickness of the n-type semiconductive layer 104 and also from the quantitative relationship between the amount of the impurities with which the p-type semiconductive layer 102 is doped and the amount of the impurities with which the n-type semiconductive layer 104 is doped so as to optimize each of the functions of the three layers concerned. However, in the usual case, the thickness of the i-type semiconductive layer is preferred to be several times to several tens of times as much as that of the p-type semiconductive layer 102 or that of the n-type semiconductive layer 104, preferably 100 A to 10 $\mu$m and more preferably 0.1 to 1.0 $\mu$m.

The n-type semiconductive layer 104 of the photoelectromotive force member 100 or 106 as shown in FIG. 1(A) or FIG. 1(B) respectively, may be formed in the same way as the p-type semiconductive layer 102 or the i-type semiconductive layer 103 except that a different impurity is used therein.

As the impurity with which the n-type semiconductive layer 104 is doped, there may be illustrated, for example, elements of Group VA of the Periodic Table such as N, P, As, Sb, Bi and the like. Of these impurities, As, P, and Sb are the most appropriate.

In order for the n-type semiconductive layer 104 to have the desired type of conductivity, the amount of the impurity with which the layer is doped may be determined appropriately depending upon its desired electrical and optical characteristics.

In the case of impurities from the Group VA of the Periodic Table, the amount may be less than $5 \times 10^{-3}$ atomic %. The doping of the n-type semiconductive layer 104 with said impurity may be conducted by introducing a dopant imparting substance in the gaseous state into either the active species generation space or the precursor generation space possibly together with a gaseous substance to generate a precursor or a gaseous stock so as to generate an active species when the layer is being formed.

As the dopant imparting substance capable of incorporating the impurity into the n-type semiconductive layer 104, a substance which is in a gaseous state at room temperature or another substance which can be easily made to be in a gaseous state, at least under the layer forming conditions, may be employed.

Usable as such substance are, for example, $PH_3$, $P_2H_4$, $PF_3$, $PF_5$, $PCl_3$, $AsH_3$, $AsF_3$, $AsF_5$, $AsCl_3$, $SbH_3$, $SbF_5$ etc.

The total amount of H and X (X=halogen atom such as F) to be contained in each of the semiconductive layers of the photoelectromotive force member as shown in FIG. 1 is preferably 1 to 40 atomic %, and more preferably 5 to 30 atomic %. For the amount of H itself, its lowest limit is 0.001 atomic %, and it is preferably a 0.01 atomic %, and more preferably a 0.1 atomic %.

The electroconductive layer 105 may be of either transparent or opaque material. Particularly when the substrate 101 is opaque as shown in FIG. 1(B) and the light radiation is incident from the side of electroconductive layer 105, it is necessary for the electroconductive layer 105 to be optically transparent or nearly so in order for the photoelectromotive force member to exhibit a sufficient photoelectric conversion effect.

As the transparent electroconductive material to form the electroconductive layer 105, there may be illustrated metal oxides such as $In_2O_3$, $SnO_2$, and ITO ($In_2O_3 + SnO_2$), and metals such as Pd, Pt, Cu, Ag, Au, and Al. As opaque electroconductive materials to form the electroconductive layer 105, there may be illustrated alloys such as NiCr, and metals such as Al, Cr, Mo, Au, Ir, Nb, Ta, V, Ti, Pt, Pd, Zn, and Ag.

The formation of the electroconductive layer 105 using these materials may be conducted by means of vacuum vapor deposition, electron beam vapor deposition or sputtering.

Since light is absorbed very effectively by the i-type semiconductive layer 103, the foregoing p-type semiconductive layer 102 of the n-type semiconductive layer 104 when situated on the side on which a light is incident is preferred to be of wider band-gap than the i-type semiconductive layer 103.

For example, in the case when the p-type semiconductive layer or the n-type semiconductive layer is desired to be a silicon carbide layer, $SiH_4$ and $CH_4$ and $H_2$, or $SiH_4$ and $SiH_2(CH_3)_2$ are introduced into the activation space to which an suitable activation energy is applied, thereby to generate an active species. In parallel with this, a precursor raw material substance such as $SiF_4$ or the like is introduced into the precursor generation space to which a suitable activation energy is applied, thereby to generate a precursor. After this, in accordance with the procedures as above mentioned, the active species and the precursor are mixed and then introduced into the deposition space while they are chemically reacted, whereby the p-type semiconductive layer or the n-type semiconductive layer to be situated on the side on which light is incident is formed on the substrate 101.

As an alternative, the semiconductive layer of wider band-gap than the i-type semiconductive layer 103 may be formed by introducing $SiF_4$ gas together with $CF_4$ gas of $C_2F_6$ gas into the precursor generation space to generate a precursor containing a carbon atom by means of an activation energy applied thereto, mixing it with an active species containing a hydrogen atom, and introducing the gaseous mixture into the deposition space while being chemically reacted. In this case, a dopant imparting gaseous substance may be added to either the precursor raw material gaseous substance or the active species raw material gaseous substance.

Figure 1C:
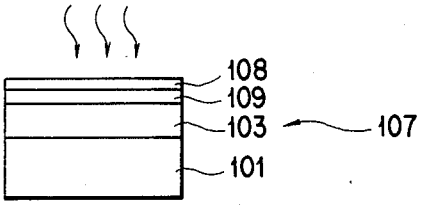
FIG. 1(C) is a cross-sectional view of a third representative embodiment of the photoelectromotive force member for a photovoltaic device provided according to this invention.

Regarding the photoelectromotive force member 107 of FIG. 1(C) provided according to this invention, it has a structure composed of photoconductive layer 103 and metallic layer 108, an optional insulating layer 109, and a substrate 101.

As the substrate 101, those as above mentioned may be used. The photoconductive layer 103 may be formed in accordance with the same procedures as in the cases of FIG. 1(A) or FIG. 1(B).

For the metallic layer 108, a metal such as Au, Pt, Pd or the like which has a large work function is used in order to make a Schottky contact with the photoconductive layer 103. The formation of the metallic layer 108 on the substrate 101 may be conducted by means of vacuum vapor deposition or electron beam vapor deposition.

The thickness of the metallic layer 108 is preferred to be less than 500 A, because light passes to photoconductive layer 103 through metallic layer 108.

The insulating layer 109 is provided to enhance the barrier between the photoconductive layer 103 and the metallic layer 108. Therefore it is not always necessary. The thickness of the insulating layer 109 may be extremely thin, for example, less than 2000 A.

In the case when the insulating layer 109 is provided in the photoelectromotive force member 107, it is preferred to be of wide band-gap.

The formation of the insulating layer 109 may be conducted by adding a gas containing a nitrogen source such as $N_2$, $NH_3$, NO, or $NO_2$, a gas containing an oxygen source such as $O_2$ or $CO_2$, or a gas containing a carbon source such as $CF_4$, $C_2F_6$, or $CH_4$ to a precursor raw material gaseous substance or an active species raw material gaseous substance.

PREFERRED EMBODIMENT OF THE INVENTION

The advantages of this invention are now described in more detail by reference to the following Examples, which are provided merely for illustrative purposes only, and are not intended to limit the scope of this invention.

EXAMPLE 1

Figure 2:
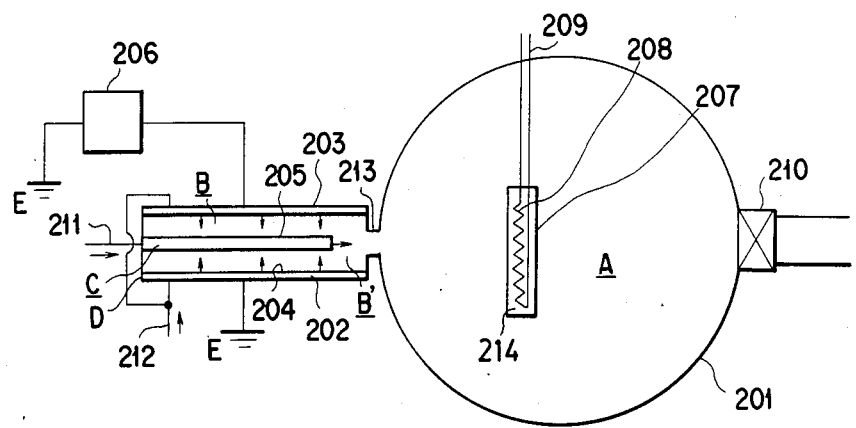
FIG. 2, FIG. 3, and FIG. 4 are schematic diagrams of apparatuses suitable for carrying out the process for preparing a photoelectromotive force member according to this invention.

In accordance with the procedures described below, a photoelectromotive force member for a PIN type solar cell was prepared by using an apparatus as shown in FIG. 2.

In FIG. 2, 201 stands for a film forming chamber having inner space A in which a substrate holder 214 for substrate 207 having electric heater 208 connected to a power source (not shown) by means of lead wires 209,209 is provided.

The film forming chamber 201 is provided with an exhaust pipe connected through main valve 210 to an exhaust pump, and the exhaust pipe is provided with a subsidiary valve (not shown) serving to break the vacuum in the film forming chamber 201.

B indicates an active species transportation space doubling as an activation space to generate an active species which has a mixing region B' situated at the downstream side. The space B opens into the film forming space A through nozzle means 213. 212 indicates a feed pipe for an active species raw material gas which is connected to the active species transportation space through circumferential wall D, which has active species raw material gas passage 202 formed by outer wall 203 and inner wall 204 having a plurality of gas feeding holes (not shown).

205 indicates a precursor transportation conduit being open at its end positioned in the mixing region B'. The position of the opening (not shown) of the conduit 205 is about 7 cm distant from the nozzle means 213. The conduit 205 has inner space C to which precursor raw material feed pipe 211 is connected.

206 indicates a microwave power source electrically connected to outer wall 203.

As the substrate 207, a polyamide film whose surface was made conductive by depositing a layer of ITO in a thickness of 1000 A was used.

The polyamide substrate was treated with a 1% solution of NaOH, washed with water, and then air-dried. This polyamide substrate was then firmly attached to the surface of the substrate holder 214 placed at a predetermined position in the film forming chamber 201. The air in the film forming chamber 201 and the active species transportation space B was evacuated by opening the main valve 210 to bring the chamber and the space to a vacuum of about $1 \times 10^{-6}$ Torr. Then the heater 208 was activated to uniformly heat the polyamide substrate 207 to about 200° C. and it was kept at this temperature.

At the same time, a gaseous mixture of $H_2$ and $B_2H_6$ ($B_2H_6/H_2 = 3000$ ppm) as the active species raw material was fed at a flow rate of 5 SCCM into the passage 202 and then into the space B through the gas liberation holes (not shown) of the inner wall 204, and a gaseous mixture of $C_2F_6$ and $SiF_4$ as the precursor raw material was fed at a flow rate of 40 SCCM into the inner space C. After the flow rates o the two gases because stable, the vacuum in the film forming chamber 201 was brought to and kept at about 0.004 Torr by regulating the main exhaust valve 210.

After the vacuum in the film forming chamber 201 became stable, the microwave power source 206 was switched on to apply a discharge energy of 200 W into both the space B and the inner space C.

After this state was maintained for 5 minutes, there was formed a p-type a-SiC (H, F) layer in a uniform thickness of 7000 A on the polyamide substrate.

After the formation of the p-type semiconductive layer was completed, application of the discharge energy was stopped and the introduction of $B_2H_6$ gas was terminated. Then the flow rates of the $H_2$ and $SiF_4$ gases were controlled to be 30 SCCM and 60 SCCM, respectively, the vacuum of the film forming chamber was brought to and kept at about 0.1 Torr by regulating the main exhaust valve 210, and a discharge energy of 300 W was applied.

After this state was maintained for 30 minutes, there was a formed a non-doped (intrinsic) semiconductive layer in a uniform thickness of 1.0 μm on the previously formed layer.

Thereafter, a gaseous mixture of $H_2$ and $PH_3$ ($PH_3/H_2 = 2000$ ppm) as the active species raw material was introduced at a flow rate of 10 SCCM, and $SiH_4$ gas as the precursor raw material was introduced at a flow rate of 30 SCCM.

Then, after the vacuum of the film forming chamber 201 was brought to and kept at about 0.04 Torr by regulating the main exhaust valve 210, a discharge energy of 200 W was applied.

After this state was maintained for 5 minutes, there was formed an n-type a-Si:F:H layer in a uniform thickness of about 5000 Å on the non-doped semiconductive layer.

Finally, an aluminum electrode layer in a thickness of about 1000 Å was applied to the n-type semiconductive layer as formed above by means of a known vacuum evaporation deposition method thereby to obtain a PIN type photovoltaic member.

As a result of evaluating the rectification characteristic and photovoltaic effect of the resulting photovoltaic member by measuring the I-V characteristics of the member (area: 1 cm$^2$), the member was determined to have a diode rectification ratio of $4 \times 10^2$ and a diode n-value of 1.3.

As for its photovoltaic characteristics, when light was radiated from the substrate side at about 100 mW/cm$^2$ of AM1 radiation, a photoelectric conversion efficiency of more than 14% was obtained.

EXAMPLE 2

Figure 3A:
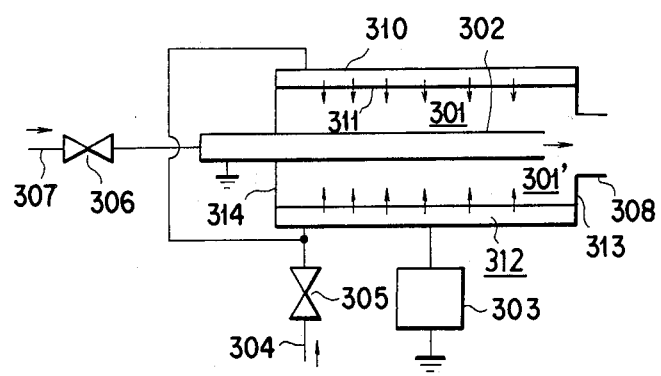
Figure 3B:
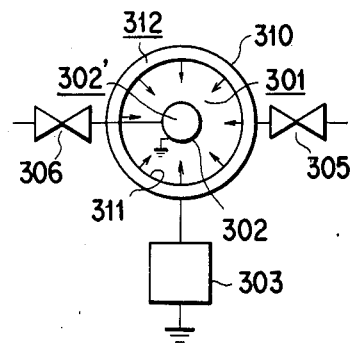
Figure 4:
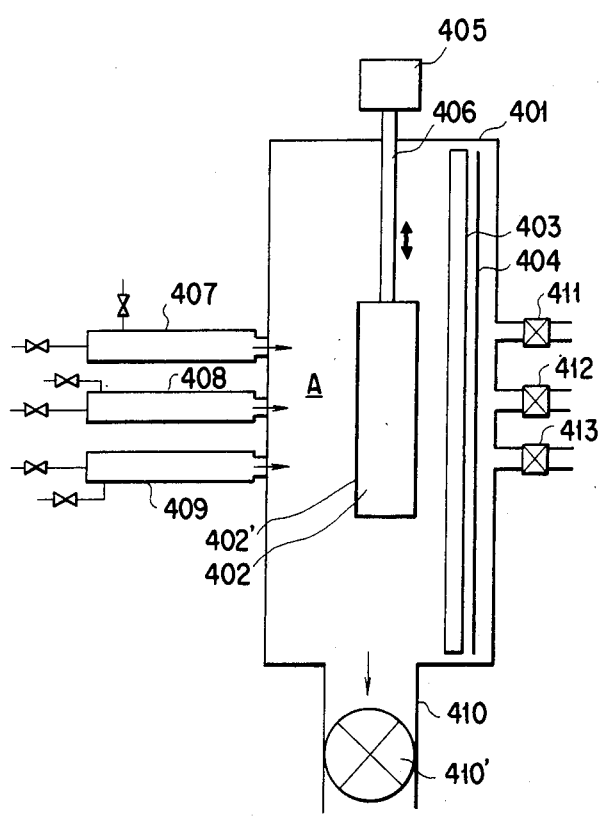

In accordance with the procedure described below, a photovoltaic member was prepared by using apparatuses as shown in FIG. 3 and FIG. 4.

FIGS. 3A and 3B are detailed schematic diagrams of one of the activation and transportation devices 407, 408, and 409 in the apparatus shown in FIG. 4.

In FIGS. 3A and 3B, 301 indicates an activation and transportation space having mixing region 301' at its downstream side, which is formed by circumferential wall 310 and two end walls 313 and 314. The circumferential wall 310 has active species raw material passage 312 formed by surrounding outer wall 310 and inner wall 311 having a plurality of gas liberation holes (not shown). 304 indicates a feed pipe for an active species raw material gas provided with a flow rate controlling valve 305, feed pipe 304 being connected to the passage 312. 302 indicates a conduit having space 302' doubling as a transportation space for a precursor raw material gas and as a precursor generation space, which is situated horizontally within the space 301. 307 indicates a feed pipe for the precursor raw material provided with flow rate controlling valve 306, which is connected to the space 302'. 303 indicates a microwave power source electrically connected to the outer wall 310. 308 indicates a narrowed passage for gas flow, which is represented by, for example, a nozzle, which connects with film forming space A of film forming chamber 401 of the apparatus as shown in FIG. 4.

In FIG. 4, 407, 408, and 409 respectively indicate activation and transportation devices as shown in FIG. 3. 402' indicates a substrate on substrate holder 402.

405 indicates a motor for rotating, lifting, and lowering the substrate holder 402 through rotary shaft 406. 403 indicates an infrared lamp for heating the substrate 402'.

404 indicates a mirror for reflecting infrared radiation toward the substrate 402'. The film forming chamber 401 is provided with exhaust pipe 410 connected through main exhaust valve 410' to a vacuum device (not shown). Subsidiary exhaust valves 411, 412, and 413 are connected to the film forming chamber 401 to break the vacuum therein.

In this example, the activation and transportation devices 407, 408, and 409 are used respectively for the formation of a n-type layer, the formation of a non-doped layer, and the formation of a p-type layer.

A stainless steel plate of thickness 1.0 mm was used as the substrate 402'.

After the substrate was cleaned in accordance with the procedure mentioned in Example 1, it was firmly attached to the surface of the substrate holder 402, and the position of the substrate 402' was lowered to the level where the top of the substrate 402' was situated under the opening of the activation and transportation device 409 by the action of the rotary shaft 406. The air in the film forming chamber 401 and the activation and transportation devices 407, 408, and 409 was exhausted by opening the subsidiary exhaust valve 411, 412, and 413 while the main valve 410' was closed, to bring their spaces to a vacuum of about $1 \times 10^{-5}$ Torr. Then, the infrared lamp was switched on to uniformly heat the substrate to about 290° C., the substrate being kept at that temperature. Each of the gases as shown in Table 1 was fed into the corresponding activation and transportation devices 407, 408, and 409 in accordance with the corresponding conditions as shown in Table 1, and the vacuum in the film forming space A was brought to and kept at about 0.002 Torr by regulating the main exhaust valve 410'. Thereafter, the microwave power source was switched on to apply a discharge energy of corresponding electric power as shown in Table 1 to each of the activation and transportation devices 407, 408, and 409, respectively.

After the microwave discharge state in each of the activation and transportation devices became stable, the substrate was lifted with a speed of 2.4 mm/minute by the action of the rotary shaft 406. In this way, there was formed firstly an n-type semiconductive layer in a thickness of about 0.4 μm, secondly an i-type semiconductive layer in a thickness of about 2.0 μm, and finally a p-type semiconductive layer in a thickness of about 0.5 μm, thereby to prepare a photovoltaic member.

It was evaluated that this member so produced has practically applicable characteristics as a photovoltaic member.

Moreover, no change in said characteristic was found even after lighter radiation of 100 mW for 24 hours.

In a comparative test wherein a phtovoltaic member having a similar structure to the above photovoltaic member which was prepared in accordance with the known glow discharge manner using SiH$_4$ was used, it was found that the photovoltaic member of this invention has a photoelectric conversion efficiency of 2.5 times that of the latter photovoltaic member.

TABLE 1

| | Active species raw material(s) | Precursor raw material(s) | Microwave electric power | Film forming rate |
|---|---|---|---|---|
| Device 407 | H$_2$: 10 SCCM (B$_2$H$_6$ 1000 ppm added) | SiF$_4$: 20 SCCM C$_2$F$_6$: 2 SCCM | 60 W | 0.5 Å/sec. |
| Device 408 | H$_2$: 30 SCCM | SiF$_4$: 30 SCCM | 300 W | 5 Å/sec. |
| Device 409 | H$_2$: 100 SCCM (PH$_3$: 2000 ppm added) | SiF$_4$: 30 SCCM | 40 W | 0.3 Å/sec. |

EXAMPLE 3

The procedures as mentioned in Example 1 were generally followed.

As the substrate, an n-type crystalline silicon plate (conductivity: 10 ohm-cm) was used. The flow rates of $H_2$ and $SiF_4$ gases were controlled to be 30 SCCM and 60 SCCM respectively, a microwave discharge energy of 300 W was applied, the vacuum in the film forming chamber 201 was controlled to be about 0.1 Torr, and after 30 minutes' process operation in this state there was formed an a-Si:F:H layer in a thickness of about 1.0 μm on the silicon plate. Thereafter, $N_2$ gas was added to $H_2$ gas at a flow rate of 90 SCCM, the flow rate of $SiF_4$ was controlled to be 10 SCCM, a microwave discharge energy of 300 W was applied, the vacuum in the film forming chamber 201 was controlled to be 0.2 Torr, and after 2 minutes' process operation in this state there was formed an a-SiN:F:H layer in a thickness of about 700 Å on the above a-Si:F:H layer.

Finally, a Pd electrode layer in a thickness of about 50 Å was formed on the a-SiN:F:H layer by means of a known electron beam vapor deposition method thereby to prepare a photovoltaic member.

The photovoltaic characteristics of this member were examined and, as a result, it was found that this member has a photoelectric conversion efficiency of 1.5 times that of a Schottky type solar cell having a similar structure to the above member, which was prepared in accordance with the known glow discharge method using $SiH_4$ gas.

What we claim is:

1. A process for preparing a photoelectromotive force member comprising a photoelectric conversion layer on a substrate, said process employing (i) a precursor as a constituent for the photoelectric conversion layer which precursor is substantially nonreactive as long as it remains in its original energy state and (ii) an active species which can react with and impart energy to the precursor to activate the precursor to a state capable of contributing to formation of said layer, said process comprising the steps of:

(a) generating said active species by subjecting a substance capable of being activated to generate said active species to the action of microwave energy in an active species generating and transporting space leading to a film forming space containing the substrate;

(b) simultaneously generating said precursor by subjecting a substance capable of generating said precursor to the action of microwave energy in a precursor generating and transporting space located separately from and within the active species generating and transporting space and open in a downstream region of that space; and (c) introducing the resulting active species and precursor into the film forming space to chemically react to form the photoelectric conversion layer on the substrate in the absence of a plasma.

2. A process for preparing a phtoelectromotive force member according to claim 1, including employing as the active species, a material which is generated by subjecting a member selected from the group consisting of $H_2$, $SiH_4$, $SiH_3F$, $SiH_3Cl$, $SiH_3Br$ and $SiH_3I$ to the action of microwave energy and employing as the precursor, a material which is generated by subjecting a member selected from the group consisting of $Si_nX_{2n+2}$ (n=1, 2, 3 or more, x=F, Cl, Br or I), $(SiX_2)_n$ (n≧3, X=F, Cl, Br or I), $Si_nHX_{2n+1}$ (n=1, 2, 3 or more, X=F, Cl, Br or I) and $Si_nH_2X_{2n}$ (n=1, 2, 3 or more, X=F, Cl, Br or I) to the action of microwave energy.

3. A process for preparing a photoelectromotive force member according to claim 1, including mixing the active species and the precursor prior to introducing them into the film forming space.

* * * * *

UNITED STATES PATENT AND TRADEMARK OFFICE
CERTIFICATE OF CORRECTION

PATENT NO. : 4,689,093

DATED : August 25, 1987

INVENTOR(S) : SHUNICHI ISHIHARA, ET AL.

It is certified that error appears in the above-identified patent and that said Letters Patent is hereby corrected as shown below:

COLUMN 3

Line 21, "an other" should read --another--.
Line 26, "object" should read --aspect--.
Line 35, "deposition which" should read --deposition space which--.

COLUMN 4

Line 21, "120° C. lower" should read --120° C., lower--.
Line 21, "plasm" should read --plasma--.
Line 66, "genersted" should read --generated--.

COLUMN 5

Line 64, "somwhat" should read --somewhat--.
Line 65, "layers." should read --layer.--.

COLUMN 6

Line 16, "which often" should read --which is often--.

COLUMN 7

Line 54, "(N=" should read --(n=--.
Line 55, "(N=" should read --(n=--.

UNITED STATES PATENT AND TRADEMARK OFFICE
CERTIFICATE OF CORRECTION

PATENT NO. : 4,689,093
DATED : August 25, 1987
INVENTOR(S) : SHUNICHI ISHIHARA, ET AL.

It is certified that error appears in the above-identified patent and that said Letters Patent is hereby corrected as shown below:

COLUMN 9

Line 9, "view points" should read --viewpoints--.
    Line 26, "of" should read --for--.
    Line 52, "Usuable" should read --Usable--.

COLUMN 10

Line 25, delete "be" (second occurrence).
    Line 26, "be the" should read --be in the--.
    Line 57, "50,000 A," should read --50,000 Å,--.
    Line 58, "A," should read --Å,--.
    Line 58, "furthermore" should read --most--.
    Line 58, "1000 A." should read --1000 Å.--.

COLUMN 11

Line 3, "a" should read --an--.
    Line 8, "lake" should read --like--.
    Line 43, "100 A" should read --100 Å--.

COLUMN 12

Line 18, delete "a" (both occurrences).
    Line 50, "an" should read --a--.
    Line 66, "of" should read --or--.

UNITED STATES PATENT AND TRADEMARK OFFICE
CERTIFICATE OF CORRECTION

PATENT NO. : 4,689,093
DATED : August 25, 1987
INVENTOR(S) : SHUNICHI ISHIHARA, ET AL.

It is certified that error appears in the above-identified patent and that said Letters Patent is hereby corrected as shown below:

COLUMN 13

Line 24, "500 A," should read --500 Å,--.
Line 30, "2000 A." should read --2000 Å.--.
Line 59, "209,209" should read --209, 209--.

COLUMN 14

Line 18, "1000 A" should read --1000 Å--.
Line 38, "o" should read --of--.
Line 38, "because" should read --became--.
Line 48, "7000 A" should read --7000 A--.

COLUMN 15

Line 5, "5000 A" should read --5000 Å--.
Line 8, "1000 A" should read --1000 Å--.
Line 44, "material provided" should read --material gas provided".

COLUMN 16

Line 14, "valve" should read --valves--.
Line 57, "0.5 A/sec." should read --0.5 Å/sec.--.
Line 59, "5 A/sec." should read --5 Å/sec.--.
Line 61, "0.3 A/sec." should read --0.3 Å/sec.--.

COLUMN 17

Line 15, "700 A" should read --700 Å--.
Line 18, "A" should read --Å--.

UNITED STATES PATENT AND TRADEMARK OFFICE
CERTIFICATE OF CORRECTION

PATENT NO. : 4,689,093

DATED : August 25, 1987

INVENTOR(S) : SHUNICHI ISHIHARA, ET AL.

It is certified that error appears in the above-identified patent and that said Letters Patent is hereby corrected as shown below:

COLUMN 18

Line 20, "phtoelectromotive" should read --photoelectromotive--.
Line 22, "species," should read --species--.
Line 28, "x=F," should read --X=F,--.

Signed and Sealed this

Thirtieth Day of April, 1991

Attest:

HARRY F. MANBECK, JR.

Attesting Officer

Commissioner of Patents and Trademarks